United States Patent [19]

Saari

[11] 4,383,224

[45] May 10, 1983

[54] NMOS CRYSTAL OSCILLATOR

[75] Inventor: Veikko R. Saari, Spring Lake Heights, N.J.

[73] Assignee: Bell Telephone Laboratories, Incorporated, Murray Hill, N.J.

[21] Appl. No.: 226,781

[22] Filed: Jan. 21, 1981

[51] Int. Cl.³ .................. H03B 5/36; H03K 12/00
[52] U.S. Cl. .................................. 331/74; 307/261; 307/268; 331/116 FE
[58] Field of Search .................. 331/74–77, 331/116 FE, 116 R, 117 R, 117 FE, 185, 186; 307/268, 261; 328/28, 31

[56] References Cited

U.S. PATENT DOCUMENTS 3,959,744  5/1976  O'Connor .................. 331/116 FE
3,978,424  8/1976  Hobo et al. .................. 331/74 X

OTHER PUBLICATIONS

Frerking, Crystal Oscillator Design and Temperature Compensation, Van Nostrand Reinhold Co., 1978, pp. 56–59.

Primary Examiner—Siegfried H. Grimm
Attorney, Agent, or Firm—Volker R. Ulbrich

[57] ABSTRACT

In an NMOS integrated circuit (10), a basic Pierce-type oscillator stage (16) which includes an inverter stage with a quartz crystal resonator (34) is coupled to a transistor-transistor logic output stage (22) through a comparator (18) and a level shifter (20) to achieve a circuit having the combination of a relatively high tolerance to parasitic capacitances and resistances and a well-controlled output duty cycle of nearly 50 percent.

4 Claims, 1 Drawing Figure

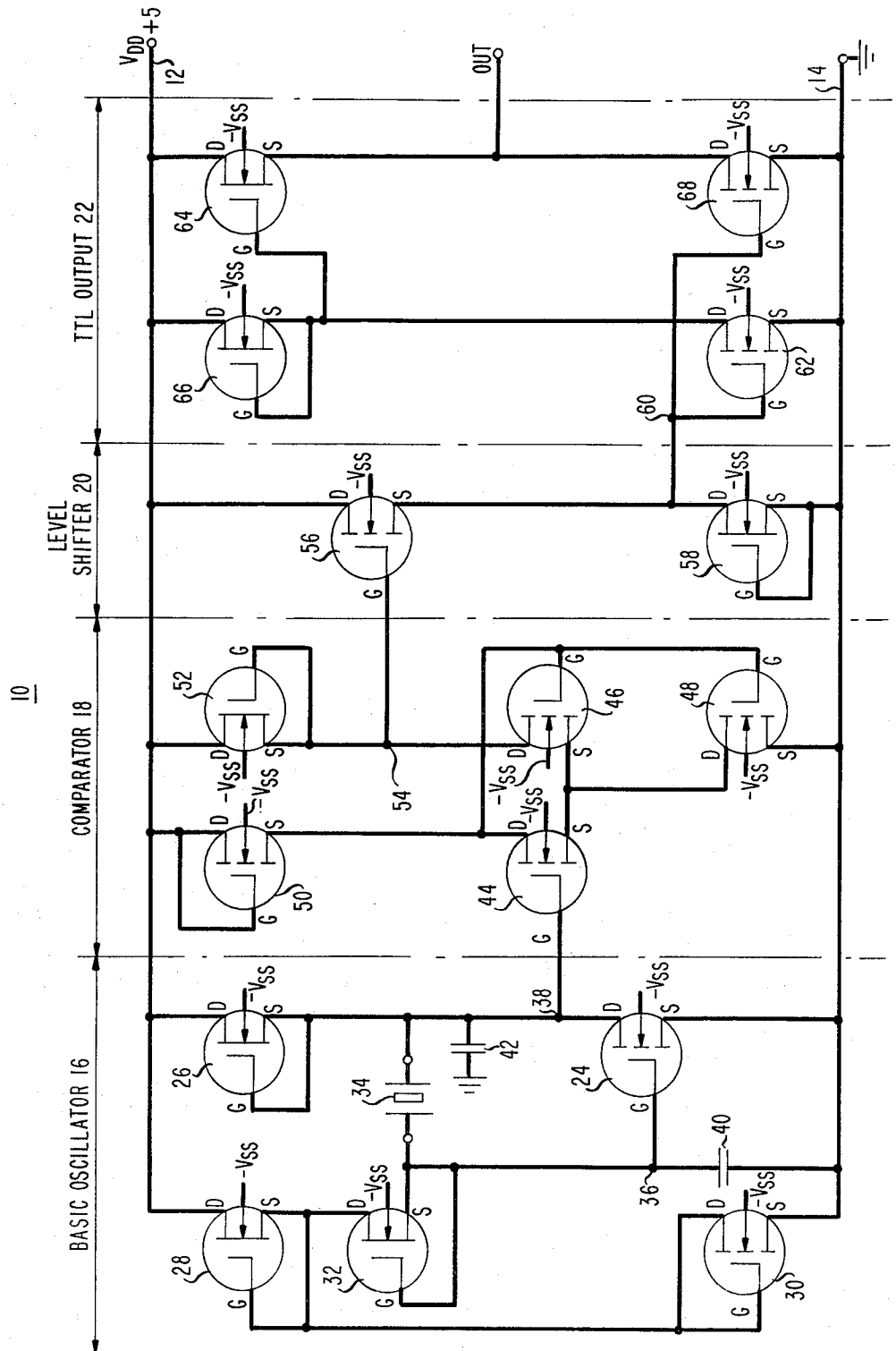

4,383,224

NMOS CRYSTAL OSCILLATOR

BACKGROUND OF THE INVENTION

The invention relates to oscillators for providing a digital train of clock pulses and relates more specifically to NMOS (N-type Metal-Oxide-Semiconductor) technology oscillators in a form suitable for integration with other circuit sections of a larger NMOS integrated digital circuit.

There are a variety of circuits for processing digital electrical signals, such as communications signals, which require a clocking pulse for their operation. Such a clocking pulse is typically generated by an oscillator circuit which includes an inverter amplifier having a fundamental resonance frequency element, such as a quartz crystal, connected in a feedback loop configuration.

Circuits which operate in a charge redistribution or switched-capacitor mode are generally MOS circuits and need for their functioning a clocking pulse provided by an oscillator. It is desirable that this oscillator be integrated as a subcircuit on the same substrate.

Integrated MOS oscillator circuits must be tolerant of the influences of parasitic capacitances and resistances which can affect frequency of the output or even prevent oscillation. Such influences are accentuated with increasing frequency. For oscillators realized with MOS technology, the parasitic capacitance and resistance problem is aggravated by various protective means which may be provided to protect the MOS devices, especially the gates, from spurious voltages arising on the external leads.

A known oscillator circuit generally referred to as a Pierce oscillator can be realized with MOS devices and has a relatively high tolerance to parasitics. However, it also has too low an output amplitude and too variable an offset voltage to permit effective coupling directly to a conventional TTL (transistor-transistor logic) output circuit.

SUMMARY OF THE INVENTION

The novel oscillator of the present invention features a Pierce-type basic oscillator stage coupled to a TTL output stage through a comparator stage and a level shifter stage. However, the basic oscillator stage has its gain enhanced by a special bias coupling transistor. The comparator stage which receives the oscillation waveform from the inverter stage includes depletion and enhancement transistors as the load elements for a differential stage with positive feedback and a particularly advantageous gate connection for the associated current-source transistor. The level shifter stage is between the comparator stage and the TTL output stage.

This arrangement provides an oscillator circuit with low power consumption and high tolerance to parasitic capacitance and resistance. It also has sufficient bias stability margins to provide adequately uniform spacing between the threshold crossings of the drive for the TTL output stage.

BRIEF DESCRIPTION OF THE DRAWINGS

The FIGURE is a schematic circuit diagram of a 3.5 mHz (megahertz) depletion load NMOS crystal oscillator 10 in accordance with the preferred embodiment of the present invention.

DESCRIPTION OF THE PREFERRED EMBODIMENT

The oscillator 10 of the FIGURE includes positive and grounded voltage supply rails 12, 14, respectively. Between the supply rails 12, 14 there are connected, in order, a Pierce-type basic oscillator stage 16, a comparator 18, a level shifter 20, and a TTL output circuit 22. All the transistors of the oscillator are either enhancement mode or depletion mode N conductivity-type metal-oxide-semiconductor devices. The bulk material of all the transistors is integral with the substrate bulk and is at the voltage $V_{ss}$ which is in this instance $-5$ volts with respect to the grounded supply rail 14. The positive supply rail 12 is at a voltage $V_{DD}$, which in this instance is $+5$ volts with respect to the grounded supply rail 14.

The basic oscillator stage 16 has an inverter formed by an enhancement mode transconductance transistor 24 with the source connected to the grounded supply rail 14 and drain connected to the source of a depletion mode inverter load transistor 26 which has its drain connected to the positive supply rail 12 and its gate connected to its source.

The impedance level of the gate node of the transconductance transistor 24 is relatively high, so that the basic oscillator stage 16 has substantially greater-than-unity open-loop gain. The drain voltage of the transconductance transistor 24 is biased roughly halfway between its gate voltage and the voltage of the positive supply rail 12, to ensure start-up capability. The transistors 24, 26 of the inverter are kept initially out of the triode mode over a wide manufacturing spread of the transistor parameters.

A biasing network biases the inverter within the basic oscillator stage 16 to an initial state of greater-than-unity gain; and there is enough on-chip crystal terminal capacitance to provide the additional phase shift around the feedback loop needed to make oscillation occur. The biasing network includes a depletion mode transistor 28 having its drain connected to the positive supply rail 12 and its gate and source connected to the gate and drain of an enhancement mode transistor 30, which has its source tied to the grounded supply rail 14. These transistors 28, 30 function to set the DC voltage at the gate of the transconductance transistor 24. A depletion mode transistor 32 of the biasing network has its drain tied to the node at which the gates of the transistors 28, 30 join and has its gate and source coupled to the gate of the transconductance transistor 24. The source node of the transistor 32 is considered the signal input node 36 for the basic oscillator stage 16 whereas the source node of the transistor 26 and drain of the transistor 24 is considered a signal output node 38. Connected between the input node 36 and the grounded supply rail 14 there is a shaping capacitor 40. Connected between the output node 38 and the grounded supply rail 14 is a second shaping capacitor 42. A quartz crystal 34 is coupled between the input node 36 and the output node 38 in a feedback loop configuration to provide the fundamental resonance frequency for the oscillator 10 and to thereby result in the generation of an approximately sinusoidal output waveform at the output node 38. The preferred crystal for the crystal 34 is a colorburst type which has a fundamental resonance frequency of 3.5 mHz.

The transistor 32, which acts as a large resistor and is a special feature of the novel oscillator 10, acts as a high frequency blocking element to increase the gain margin of the oscillating feedback loop by preventing the biasing network from loading down the signal input node 36. This feature permits the use of relatively large width/length ratios in transistors 28 and 30, which enables better tracking of the characteristics of the inverter depletion load transistor 26 and the biasing network transistor 28 to be achieved. This is important in providing a sufficiently stable bias voltage at the output node 38.

The output node 38 of the basic oscillor stage 16 is coupled to one gate of the first enhancement mode transistor 44 of a differential pair of transistors 44, 46 forming an input for the comparator stage 18. The sources of the differential pair 44, 46 are connected to the drain of a third, differential pair current source transistor 48, which in turn has its source tied to the grounded supply rail 14. The gate of the second transistor 46 is tied to the drain of the first transistor 44 to provide an increase in gain by means of positive feedback. The gate of the third transistor 48 is tied to that same node to reduce the range of voltage swing at the gate of the second transistor 46 in order to tighten control of the hysteresis of the comparator 18. The drains of the first and second differential pair transistors 44, 46 are tied to the sources of, respectively, an enhancement load transistor 50 and a depletion load transistor 52 with the drains of both of these load transistors 50, 52, as well as the gate of the load transistor 50, being tied to the positive supply voltage rail 12. The gate and source of the load transistor 52 are tied together and to an output node 54 of the comparator 18.

Particularly advantageous features of the comparator 18 are that the gate of the third, differential pair current source transistor 48 is tied to the drain of the first differential pair transistor 44 to keep the voltage swing there relatively small and that the two load transistors 50, 52 are of unlike mode types to enable the drain of the second differential pair transistor 46 to swing nearly the full voltage range between the supply rails 12, 14. This provides a voltage swing at the drain of the second differential pair transistor 46 which is much greater than that at the output node 38 of the basic oscillator stage 16. At the same time, the voltage of the drain of the first differential pair transistor 44, which is the reference input of the comparator stage 18, stays within a small range included near the center of the voltage range of the output node 38 of the basic oscillator stage. As a result, the comparator stage 18, driven by the basic oscillator stage 16, has the following important features: (1) The drain of the second differential pair transistor 46 can swing over nearly the full voltage range between the positive supply rail 12 and the grounded supply rail 14; (2) The voltage swing at the gate of the second differential pair transistor 46 is relatively small and limited by the negative feedback applied to the third, current-source differential pair current-source transistor 48; (3) The switching time points of the comparator stage 18 are nearly uniformly spaced and are fairly insensitive to manufacturing variations and temperature.

The output node 54 of the comparator stage 18 is coupled to the gate of an enhancement mode source follower transistor 56 which has its drain connected to the positive supply rail 12 and its source connected to the drain of a depletion mode current source transistor 58 having its source and gate tied to the grounded supply rail 14. The drain of the current source transistor 58 is at an output node 60, which is coupled to the TTL output stage 22.

The TTL output stage 22 includes four transistors 62, 64, 66, 68 of which the transistors 62, 68 are enhancement mode transconductance transistors with gates connected to the output node 60 of the level shifter 20, drains connected to the respective sources of the load transistors 64, 66, and sources tied to the grounded supply rail 14. The load transistors 64, 66, with their drains connected to the positive supply rail 12, both have their gates connected to the source of the load transistor 66. The source of the load transistor 64 and the drain of the transconductance transistor 62 lead to an output terminal 70 for the oscillator 10.

The level shifter 20 and the TTL output stage 22 are typical of subcircuits presently used in MOS integrated circuits.

It is a feature of the oscillator 10 that the basic Pierce-type oscillator stage 16 is coupled to the TTL output stage 22 through the special comparator 18 and level shifter 20 to provide the desired characteristic 50% output duty cycle to within a few percentage points. This makes feasible in the circuit 10 the use of the Pierce network topology with its inherent high tolerance to crystal parasitics, and permits the entire oscillator circuit 10 to be realized with NMOS technology. The oscillator circuit 10 is not limited to the oscillating frequency of the particular crystal 34, which in this particular circuit is external to the integrated circuit itself, but can indeed be operated at any desired frequency by supplying the appropriate resonator between the input node 36 and output node 38 of the inverter 16.

What is claimed is:

1. An electronic oscillator of the type having a ground potential supply means, a positive potential supply means to which there are connected a basic oscillator stage coupled to a logic output stage, characterized by:

a voltage comparator, followed by a voltage level shifter, coupled between said basic oscillator and said output stage, said basic oscillator stage comprising an inverter and a resonator connected in a feedback loop to said inverter and comprising also a biasing network, said biasing network including:

a first, enhancement transistor with its source connected to said ground supply means and its gate connected to its drain;

a second, depletion transistor with its drain connected to said positive supply means and its gate and source connected to the gate and drain of said first transistor of said biasing network; and a third, depletion transistor with its drain connected to the node of juncture of said first and second transistors, and its gate and source connected to an input node of said inverter and to one side of said resonator.

2. An electronic oscillator of the type having a ground potential supply means, a positive potential supply means to which there are connected a basic oscillator stage coupled to a logic output stage, characterized by:

a voltage comparator, followed by a voltage level shifter, coupled between said basic oscillator and said output stage, said comparator comprising first and second transistors connected as a differential pair and a third transistor serving as a current source for said differential pair;

said first differential pair transistor having its gate connected to the drain of a transconductance transistor and its drain connected to the source of an enhancement mode transistor which has its gate and drain connected to said positive supply means, said transconductance transistor having its source connected to said ground supply means;

said second differential pair transistor having its drain connected to the gate and the source of a depletion mode transistor, which in turn has its drain connected to said positive supply means;

the sources of said first and second differential pair transistors being connected to the drain of said third, differential pair current source transistor, and the source of said third, differential pair current source transistor being connected to said negative supply means, the gates of said second differential pair transistor and said third, differential pair current source transistor being coupled to the drain of said first differential pair transistor.

3. The apparatus defined in claim 2 wherein said basic oscillator stage (16) comprises a crystal resonator (34) connected within a feedback loop configuration to an inverter.

4. The apparatus defined in claim 3 wherein said basic oscillator stage comprises an inverter having a biasing network which comprises first, second and third biasing network transistors;

said second biasing network transistor being a depletion transistor with its drain connected to said positive supply means;

said first biasing network transistor being an enhancement transistor with its source connected to said ground supply means, its gate connected to its drain, and its gate also connected to the gate and source of said second biasing network transistor; and, said third biasing network transistor having its drain connected to the source of said second biasing network transistor and its gate and source connected to the gate of said transconductance transistor of said basic oscillator stage.

* * * * *